(12) United States Patent
Uemoto

(10) Patent No.: US 7,940,344 B2
(45) Date of Patent: May 10, 2011

(54) DISPLAY SUBSTRATE, METHOD OF MANUFACTURING THE SAME AND DISPLAY APPARATUS HAVING THE SAME

(75) Inventor: Tsutomu Uemoto, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 839 days.

(21) Appl. No.: 11/561,534

(22) Filed: Nov. 20, 2006

(65) Prior Publication Data

US 2007/0263131 A1 Nov. 15, 2007

(30) Foreign Application Priority Data

May 12, 2006 (KR) .................. 10-2006-0042898

(51) Int. Cl.
*G02F 1/1343* (2006.01)
(52) U.S. Cl. ........................................... 349/39
(58) Field of Classification Search ............. 349/38, 349/39, 42, 43
See application file for complete search history.

(56) References Cited

U.S. PATENT DOCUMENTS

| | | | |
|---|---|---|---|
| 7,256,060 B2 * | 8/2007 | Park | 438/30 |
| 2005/0272189 A1 * | 12/2005 | Cho | 438/163 |

* cited by examiner

*Primary Examiner* — Sarah Hahm
(74) *Attorney, Agent, or Firm* — F. Chau & Associates, LLC

(57) ABSTRACT

A display substrate includes a plurality of pixels. Each of the pixels includes a switching element, a storage capacitor, a storage line and a pixel electrode. The switching element includes a polycrystalline silicon layer having a channel portion and a doped portion, a gate electrode, a source electrode and a drain electrode. The gate electrode is formed on the channel portion and has a lower layer and an upper layer. The source electrode and the drain electrode make contact with the doped portion. The storage capacitor includes a first storage electrode formed from a layer substantially same as the polycrystalline silicon layer and a second storage electrode formed from a layer substantially same as the lower layer of the gate electrode.

11 Claims, 13 Drawing Sheets

DISPLAY SUBSTRATE, METHOD OF MANUFACTURING THE SAME AND DISPLAY APPARATUS HAVING THE SAME

CROSS-REFERENCE TO RELATED APPLICATIONS

The present application claims priority to Korean Patent Application No. 2006-42898, filed on May 12, 2006, the disclosure of which is incorporated by reference in its entirety.

BACKGROUND OF THE INVENTION

1. Technical Field

The present disclosure relates to a display substrate, a method of manufacturing the display substrate and a display apparatus having the display substrate. More particularly, the present invention relates to a display substrate capable of enhancing aperture ratio, 2. Discussion of the Related Art In general, a liquid crystal display (LCD) apparatus includes a display substrate, an opposite substrate that faces the display substrate and a liquid crystal layer interposed between the display substrate and the opposite substrate. The display substrate includes a plurality of gate lines, a plurality of source lines crossing the gate lines, a plurality of switching elements electrically connected to the gate lines and the data lines and a plurality of pixel electrodes electrically connected to the switching elements. Each of the switching elements includes a gate electrode extended from the gate line, a semiconductor layer that is insulated from the gate line and has a channel portion and a doped portion, a source electrode that is extended from the source line and is electrically connected to the doped portion and a drain electrode that is spaced apart from the source electrode and is electrically connected to the doped portion.

Recently, the LCD apparatus has been applied to apparatuses, such as a mobile phone, a camcorder, a digital camera an audio player, etc. The LCD apparatus should have a high resolution and a high brightness to display various to contents. For example, a small-sized LCD apparatus applied to a mobile apparatus increases power consumption to increase brightness of a backlight assembly in order to have a high resolution and a high brightness. However, the method of increasing power consumption is limited, when the mobile apparatus employs a portable power supplier, such as a battery.

SUMMARY OF THE INVENTION

Exemplary embodiments of the present invention provide a display substrate capable of enhancing aperture ratio, a method of manufacturing the above-mentioned display substrate, and a display apparatus having the above-mentioned display substrate.

In an exemplary embodiment of the present invention, a display substrate includes a plurality of pixels. Each of the pixels includes a switching element, a storage capacitor, a storage line and a pixel electrode. The switching element includes a polycrystalline silicon layer having a channel portion and a doped portion, a gate electrode, a source electrode and a drain electrode. The gate electrode is formed on the channel portion and has a lower layer and an upper layer. The source electrode and the drain electrode make contact with the doped portion. The storage capacitor includes a first storage electrode formed from a layer substantially same as the polycrystalline silicon layer and a second storage electrode formed from a layer substantially same as the lower layer of the gate electrode. The storage line is formed from layers substantially same as the lower and the upper layers of the gate electrode and is electrically connected to the second storage electrode. The pixel electrode is electrically connected to the switching element.

In an exemplary embodiment of the present invention, there is provided a method of manufacturing a display substrate. A polycrystalline silicon layer is formed on a base substrate. The polycrystalline silicon layer is firstly doped with impurities to form a channel portion of a switching element and a first storage electrode. A gate metal layer having a lower layer including a transparent conductive material and an upper layer including a metal is formed on the base substrate having the channel portion and the first storage electrode. The gate metal layer is patterned to form a gate metal pattern and a second storage electrode that is formed from the lower layer of the gate metal layer and overlaps with the first storage electrode. The polycrystalline silicon layer is secondly doped with impurities to form a doped portion of the switching element. A source metal layer is formed on the base substrate having the doped portion and is patterned to form a source metal pattern. A pixel electrode electrically connected to the switching element is formed.

In an exemplary embodiment of the present invention, a display apparatus includes a display substrate having a plurality of pixels, an opposite substrate and a liquid crystal layer interposed between the display substrate and the opposite substrate. The opposite substrate faces the display substrate and is combined with the display substrate. Each of the pixels includes a switching element, a storage capacitor, a storage line and a pixel electrode. The switching element includes a polycrystalline silicon layer having a channel portion and a doped portion, a gate electrode, a source electrode and a drain electrode. The gate electrode is formed on the channel portion and has a tower layer and an upper layer. The source electrode and the drain electrode make contact with the doped portion. The storage capacitor includes a first storage electrode formed from a layer substantially same as the polycrystalline silicon layer and a second storage electrode formed from a layer substantially same as the lower layer of the gate electrode. The storage line is formed from layers substantially same as the lower and the upper layers of the gate electrode and is electrically connected to the second storage electrode. The pixel electrode is electrically connected to the switching element.

According to exemplary embodiments of the present invention, an aperture ratio of the display apparatus is enhanced, thereby improving display quality

BRIEF DESCRIPTION OF THE DRAWINGS

Exemplary embodiment of the present invention can be understood in more detail from the following descriptions taken in conjunction with the accompanying drawings in which.

DESCRIPTION OF THE EMBODIMENTS

Exemplary embodiments of the invention are described more fully hereinafter with reference to the accompanying drawings. This invention may, however, be embodied in many different forms and should not be construed as limited to the exemplary embodiments set forth herein.

Figure 1:
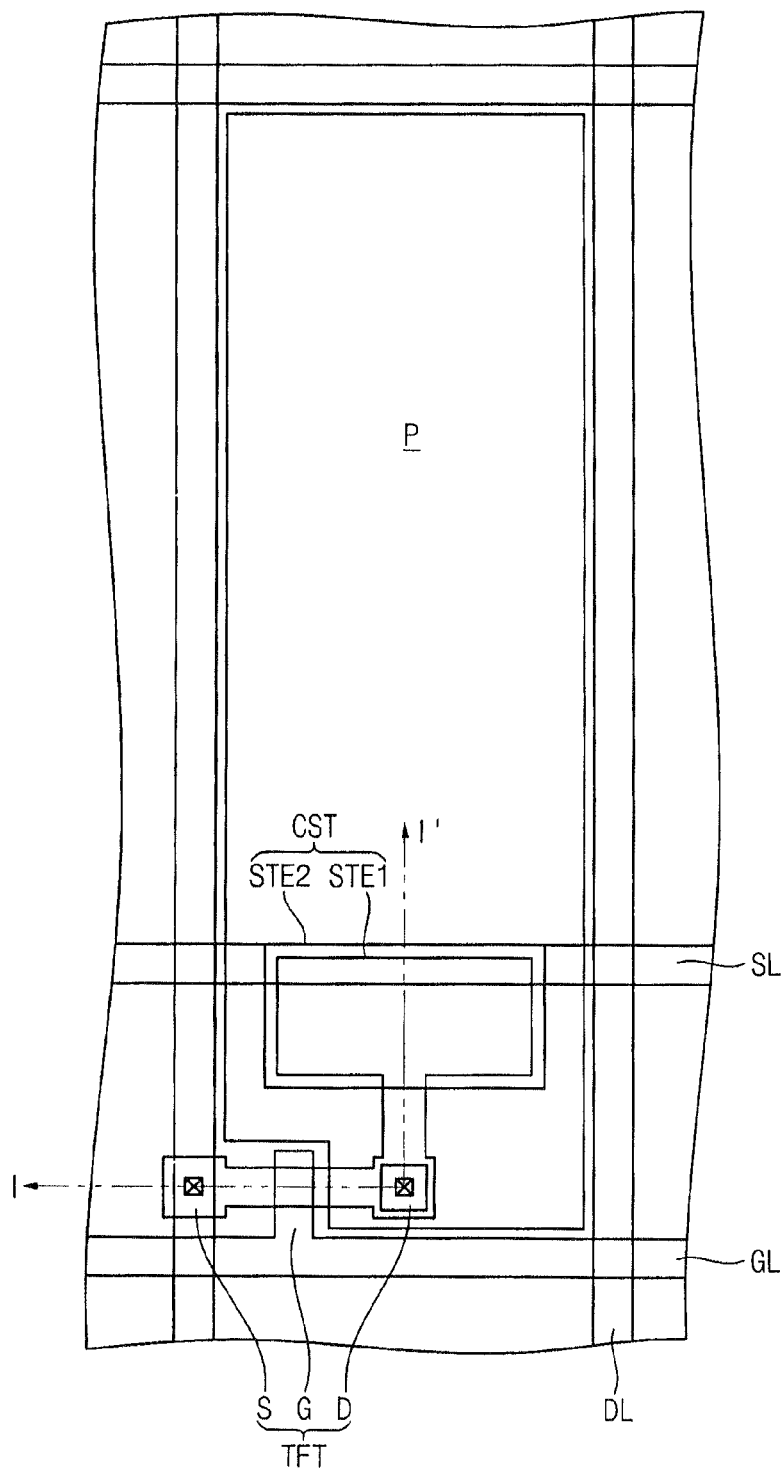
FIG. 1 is a plan view illustrating a display apparatus according to an exemplary embodiment of the present invention.
Figure 2:
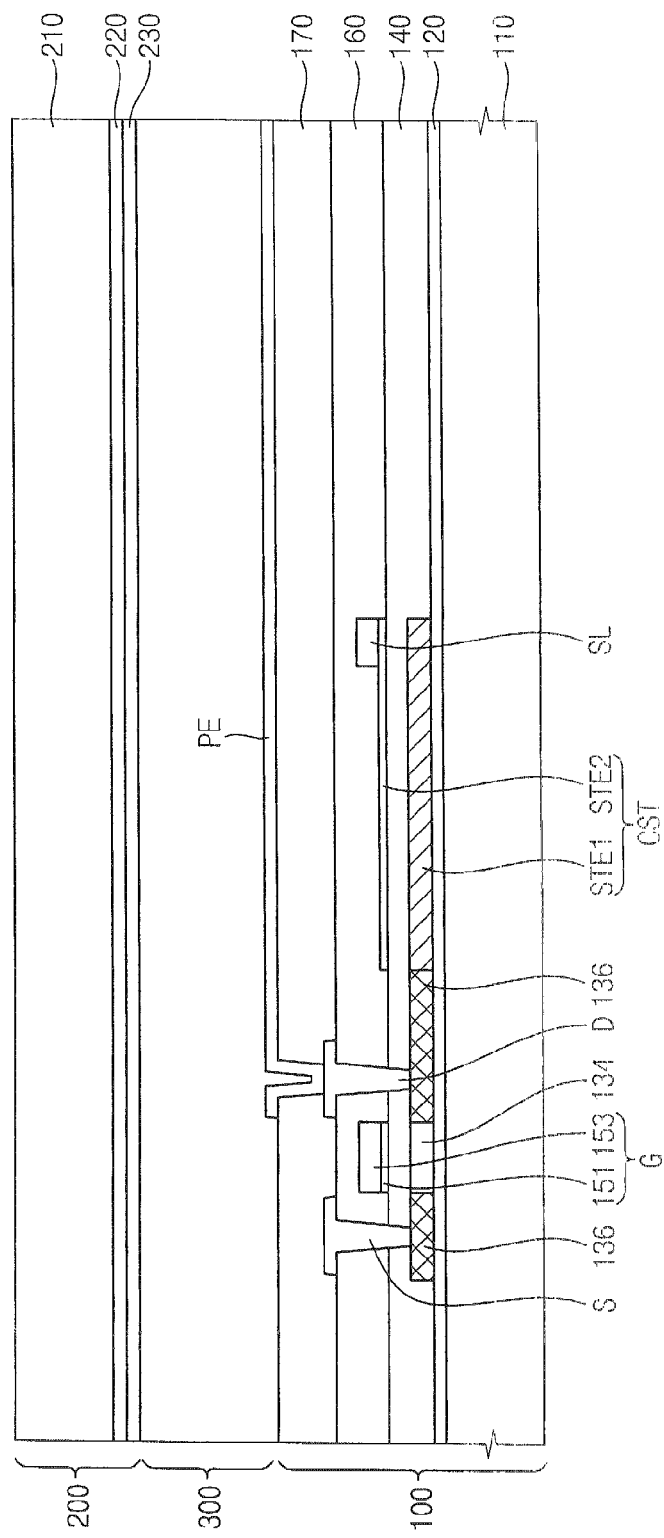
FIG. 2 is a cross-sectional view taken along a line I-I' in FIG. 1.

FIG. 1 is a plan view illustrating a display apparatus according to an exemplary embodiment of the present invention. FIG. 2 is a cross-sectional view taken along a line I-I' in FIG. 1.

Referring to FIGS. 1 and 2, a display apparatus includes a display substrate 100 and an opposite substrate 200 that faces the display substrate 100 and a liquid crystal layer 300 interposed between the display substrate 100 and the opposite substrate 200. The display substrate 100 includes a first base substrate 110 and a plurality of pixels P that is formed on the first base substrate 110 and is arranged in a matrix. A pixel electrode PE is formed in each of the pixels P. The opposite substrate 200 includes a second base substrate 210, a color filter layer 220 formed on the second base substrate 210 and a common electrode 230 corresponding to the pixel electrode PE.

Particularly, the display substrate 100 includes a plurality of gate lines GL. A plurality of source lines DL, a plurality of switching elements TFT, a plurality of storage capacitors CST and a plurality of pixel electrodes PE. The storage capacitors CST to are electrically connected to each other via a storage line SL.

The gate lines GL are formed from a gate metal layer and extend in a first direction, The gate metal layer has a tower layer 151 including a transparent conductive material and an upper layer 153 including a metal maternal. The lower layer 151 may include, for example, a metal oxide and/or a metal nitride, which has indium (In), strontium (Sn), zinc (Zn), aluminum (Al), and/or gallium (Ga). The upper layer 153 may include, for example, aluminum, an aluminum alloy, molybdenum (Mo), a molybdenum alloy, chromium (Cr), tantalum (Ta), titanium (Ti). Furthermore, the upper layer 153 may include a single layer or a multiple layer. Particularly, the upper layer 153 may include a single layer having, for example, molybdenum, molybdenum-tantalum, molybdenum-tungsten, and/or aluminum-nickel. Alternatively, the upper layer 153 may include a multiple layer such as, for example, a molybdenum/aluminum layer, a titanium/aluminum/titanium layer, and/or a molybdenum/aluminum/molybdenum layer.

The source lines DL are formed from a source metal layer and extend in a second direction substantially perpendicular to the first direction. The source metal layer may include, for example, copper (Cu), a copper alloy, aluminum, an aluminum alloy, silver (Ag), a silver alloy, molybdenum, a molybdenum alloy, chromium, tantalum, and/or titanium. Furthermore, the source metal layer may include a single layer or a multiple layer having a plurality of metal layers including a metal different from each other. Particularly, the source metal layer may include, for example, molybdenum and/or a molybdenum alloy.

Each of the switching elements TFT is formed in the pixel P defined by the to gate lines GL and the source lines DL.

Each of the switching element TFT includes a polycrystal line silicon layer having a channel portion 134 and a doped portion 136 into which impurities are implanted at a relatively high concentration, a gate electrode G that is electrically connected to the gate line GL and is formed on the channel portion 134, a source electrode S that is electrically connected to the source line DL and makes contact with the doped portion 136 and a drain electrode D that is spaced apart from the source electrode S and makes contact with the doped portion 136. Particularly, n$^+$ impurities may be implanted into the doped portion 136 at a concentration of about $1E15/cm^2$. The polycrystalline silicon layer may be crystallized through a sequential lateral solidification (SLS) process. A grain size of the polycrystalline silicon layer may be about several micrometers.

The storage capacitor CST includes a first storage electrode STE1 that is formed from a layer substantially the same as the polycrystalline silicon layer and a second storage electrode STE2 electrically connected to the storage line SL to which a common voltage is applied.

Particularly, the first storage electrode STE1 is crystallized through the SLS process. Thus, a transmittance of the first storage electrode STE1 can be enhanced. For example, n$^-$ impurities may be implanted into the first storage electrode STE1 at a concentration of about $1E13/cm^2$. Thus, the storage capacitor CST may have a higher capacitance. The second storage electrode STE2 is formed from a layer substantially the same as the lower layer 151 of the gate metal layer. Particularly, the second storage electrode STE2 includes a transparent conductive material.

The storage line SL is formed from a layer substantially same as the gate metal layer. Particularly, the storage line SL includes a lower layer 151 and an upper layer 153.

Each of the pixel electrodes PE is electrically connected to each of the switching element TFT. The pixel electrode PE is electrically connected to the drain electrode D of the switching element TFT and is formed in the pixel P. The pixel electrode PE includes a transparent conductive material. The transparent conductive material includes a metal oxide and/or a metal nitride, which has, for example, indium, strontium, zinc, aluminum, and/or gallium.

FIGS. 3 to 12 are cross-sectional views illustrating a method of manufacturing a display substrate illustrated in FIG. 1.

Figure 3:
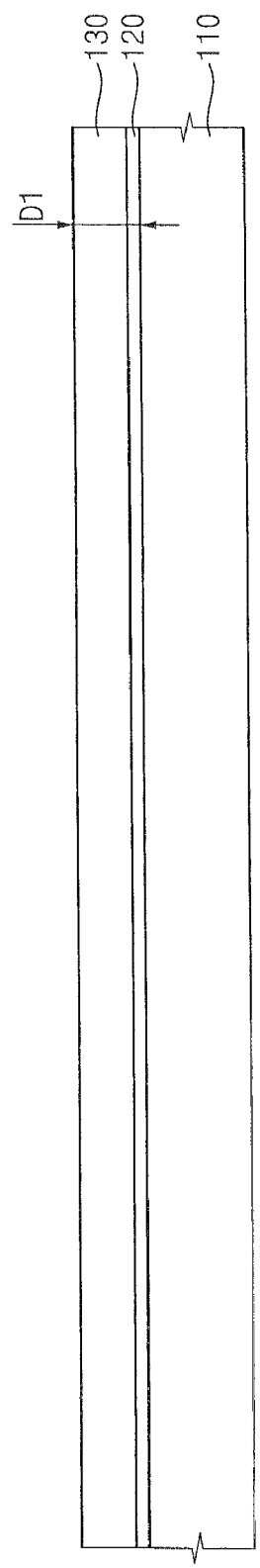
FIGS. 3 to 12 are cross-sectional views illustrating a method of manufacturing a display substrate illustrated in FIG. 1 according to an exemplary embodiment of the present invention.

Referring to FIGS. 1 and 3, a blocking layer 120 is formed on the first base substrate 110. An amorphous silicon layer 130 having a first thickness D1 is formed on the first base substrate 110 having the blocking layer 120. The first thickness D1 is about 600 Å.

The amorphous silicon layer 130 having the first thickness D1 is crystallized through the SLS process to form a polycrystalline silicon layer. The SLS process irradiates a laser sequentially on an object while moving the object or a laser apparatus generating the laser in a lateral direction to grow a grain of the object, which has a size no less than about several micrometers.

When the amorphous silicon layer 130 is crystallized through the SLS process, the amorphous silicon layer 130 having a relatively great thickness is advantageous in crystallizing. For example, the first thickness D1 may be about 600 Å.

The polycrystalline silicon layer crystallized through the SLS process is etched to reduce a thickness of the polycrystalline silicon layer. An etched polycrystalline silicon layer has a second thickness D2, for example, about 300 Å.

When a thickness of the polycrystalline silicon layer is about 500 Å, a light transmittance of the polycrystalline silicon layer is about 20% with respect to a wavelength of about 400 nm, and about 70% with respect to a wavelength of about 480 nm, and about 40% with respect to a wavelength of about 600 nm. Furthermore, a peak transmittance of the polycrystalline silicon layer is about 50%. In contrast, when a thickness of the polycrystalline silicon layer is about 250 Å, a peak transmittance of the polycrystalline silicon layer is about 85%. As the above, the smaller a thickness of the polycrystalline silicon layer is, the greater a light transmittance of the polycrystalline silicon layer is.

Thus, after forming the polycrystalline silicon layer that has a first thickness D1 to easily crystallize the polycrystalline silicon layer, the polycrystalline silicon layer is etched so as to have the second thickness D2 smaller than the first thickness D1.

Figure 4:
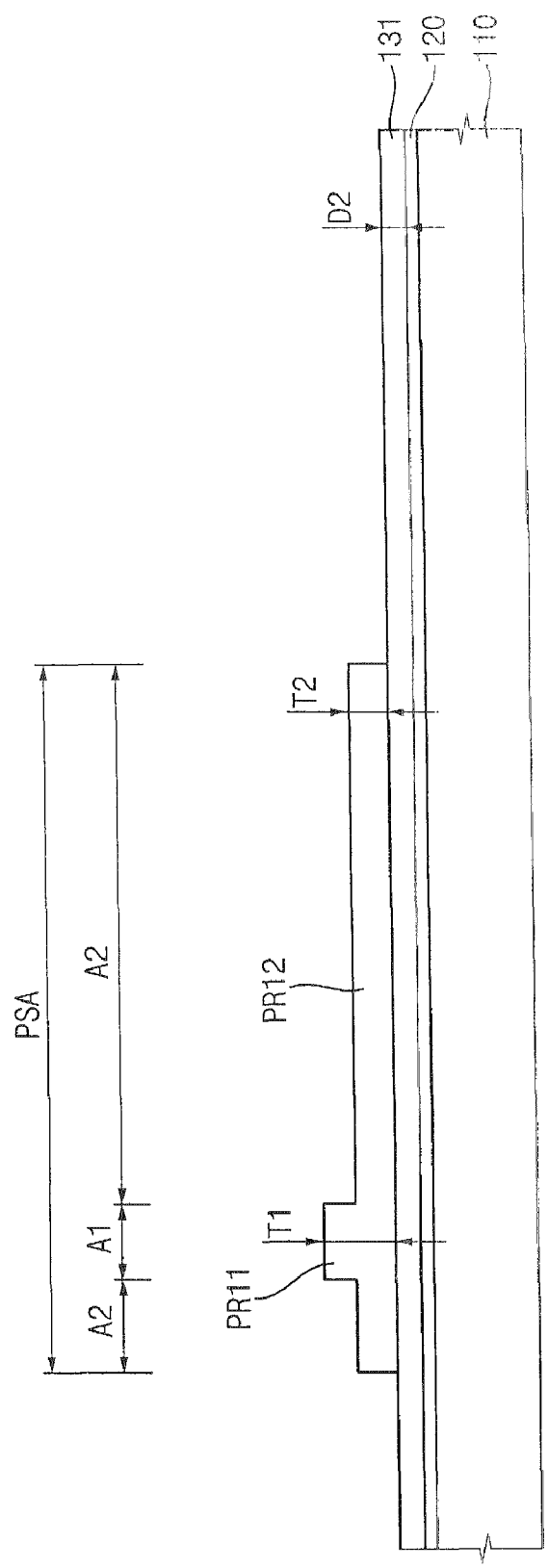

Referring to FIGS. 1 and 4, a first photoresist film is coated on the polycrystalline silicon layer 131 having the second thickness D2 and is patterned to form a first photoresist pattern. The first photoresist pattern includes a first photo-pattern PR11 and a second photo-pattern PR12. The first photoresist pattern PR11 is formed in a polycrystalline silicon area PSA of the pixel P. Particularly, the first photo pattern PR11 is formed in a first area A1 corresponding the channel portion 134 of the switching element TFT, and the first photo-pattern PR11 has a first thickness T1. The second photo-pattern PR12 is formed in a second area A2 corresponding the doped portion 136 of the switching element TFT and the storage capacitor CST, and the to second photo-pattern PR12 has a second thickness T2. The first thickness T1 is greater than the second thickness T2.

Figure 5:
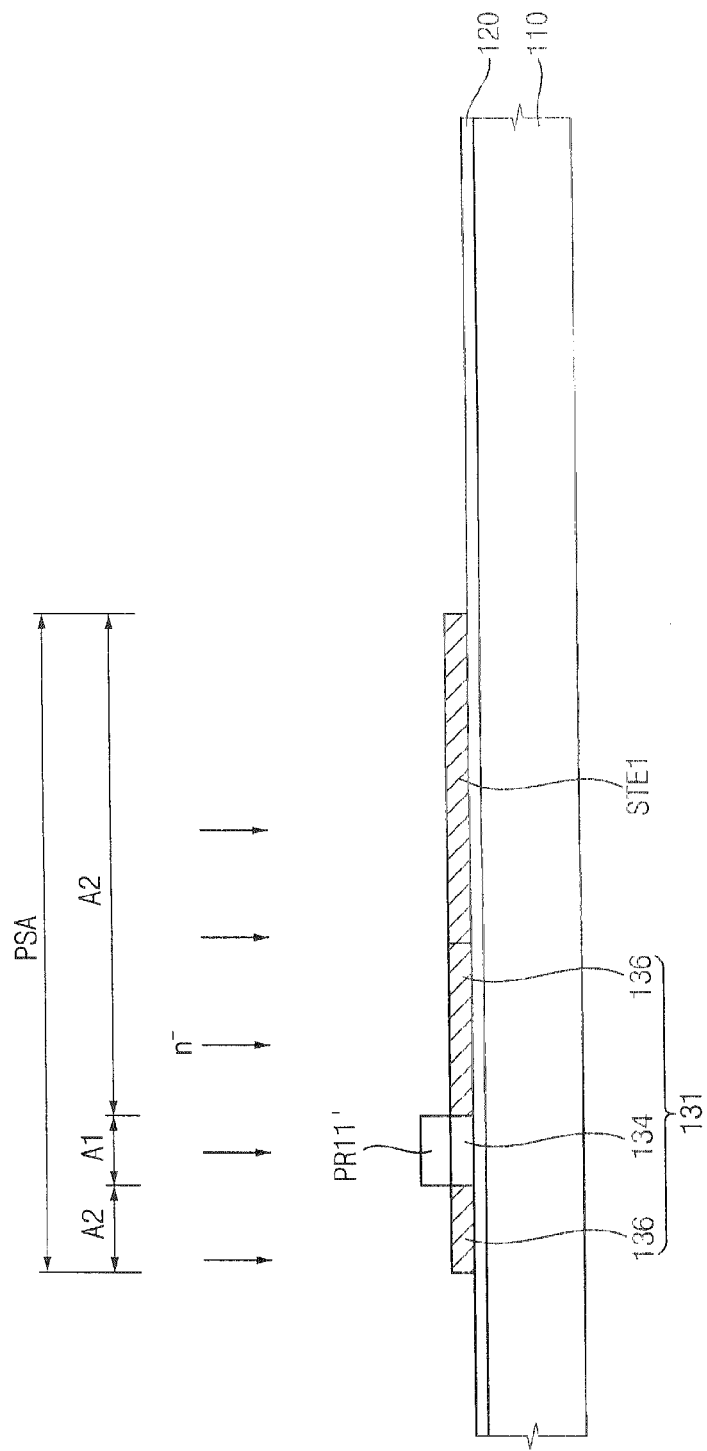

Referring to FIGS. 1 and 5, the polycrystalline silicon layer 131 is patterned using the first and the second photo-patterns PR11 and PR12 to remove a portion of the polycrystalline silicon layer 131 so that a remaining polycrystalline silicon layer 131 is disposed in the polycrystalline silicon area PSA.

The first and the second photo-patterns PR11 and PR12 are ashed. Particularly, the first photo-pattern PR11 is ashed to form a first remaining photo-pattern PR11', and the second photo-pattern PR12 are removed to expose the polycrystalline silicon layer 131 corresponding to the second area A2.

Impurities are implanted into the polycrystalline silicon layer 131 corresponding to the second area A2 by using the first remaining photo-pattern PR11' as a mask to firstly dope the polycrystalline silicon layer 131. Particularly, n⁻ impurities may be implanted into the polycrystalline silicon layer 131 corresponding to the second area A2 at a concentration of about $1E13/cm^2$. A firstly doped polycrystalline silicon layer includes the first storage electrode STE1 of the storage capacitor CST. A portion of the polycrystalline silicon layer 131, which is not doped with the impurities, corresponds to the channel portion 134.

The first remaining photo-pattern PR11' is removed through a stripping process.

Figure 6:
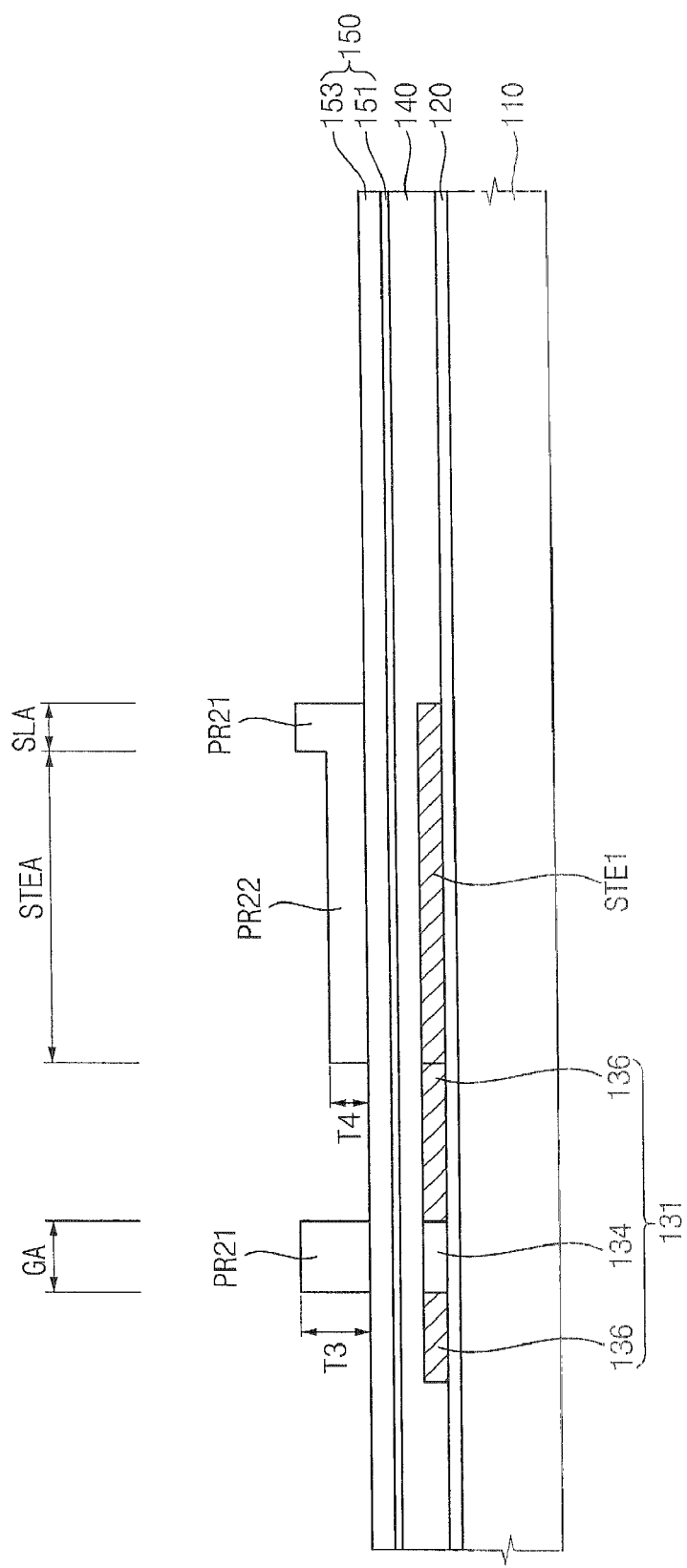

Referring to FIGS. 1 and 6, a first insulating layer 140 and a gate metal layer 150 are sequentially formed on the first base substrate 110 having the channel portion 134 and the first storage electrode STE1.

The gate metal layer 150 has a lower layer 151 including a transparent conductive material and an upper layer 153 including a metal material. The lower layer 151 may include a metal oxide and/or a metal nitride, which has, for example, indium, strontium, zinc, aluminum gallium. Particularly, the upper layer 153 may include a single layer having, for example; molybdenum, molybdenum-tantalum, molybdenum-tungsten, and/or aluminum-nickel. Alternatively, the upper layer 153 may include a multiple layer such as, for example, a molybdenum/aluminum layer, a titanium/aluminum/titanium layer, and/or a molybdenum/aluminum/molybdenum layer.

A second photoresist film is coated on the first base substrate 110 having the gate metal layer 150 and is patterned to form a second photoresist pattern. The second photoresist pattern includes a first photo-pattern PR21 and a second photo-pattern PR22. Particularly, the first photo-pattern PR21 is disposed in a gate electrode area GA corresponding to the gate electrode G, a gate line area (not shown) corresponding to the gate line GL and a storage line area SLA corresponding to the storage line SL. The first photo-pattern PR21 has a third thickness T3. The second photo-pattern PR22 is formed in a storage electrode area corresponding to the second storage electrode STE2. The second photo-pattern PR22 has a fourth thickness T4. The third thickness T3 is greater than the fourth thickness T4.

Figure 7:
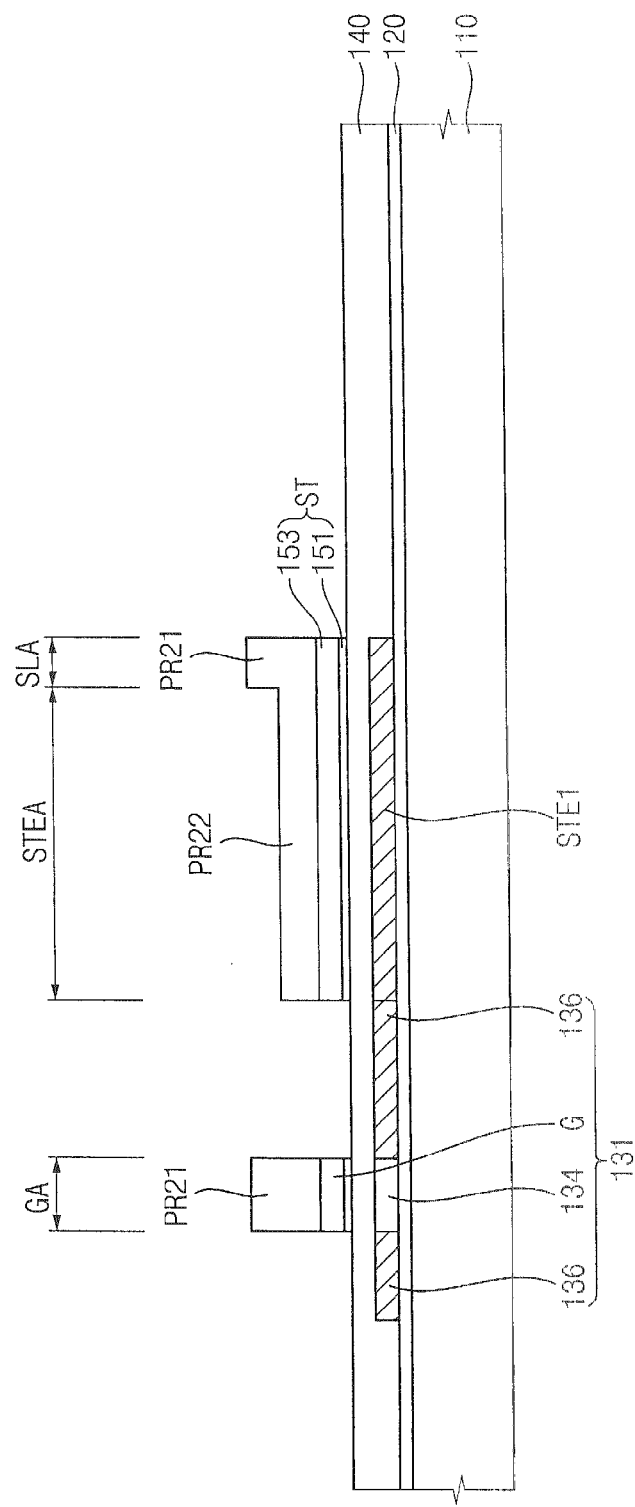

Referring to FIGS. 1 and 7, the gate metal layer 150 is patterned by using the first photo-pattern PR21 and the second photo-pattern PR22 to form the gate electrode G, the gate line GL and a storage metal pattern ST. Each of the gate electrode G, the gate line GL and the storage metal pattern ST includes a lower layer 151 and an upper layer 153, which are formed from the lower layer 151 and the upper layer 153 of the gate metal layer 150. The second storage electrode STE2 and the storage line SL are formed from the storage metal pattern ST through following processes.

The thickness of the second photoresist pattern PR21 and PR22 is reduced through an ashing process.

Figure 8:
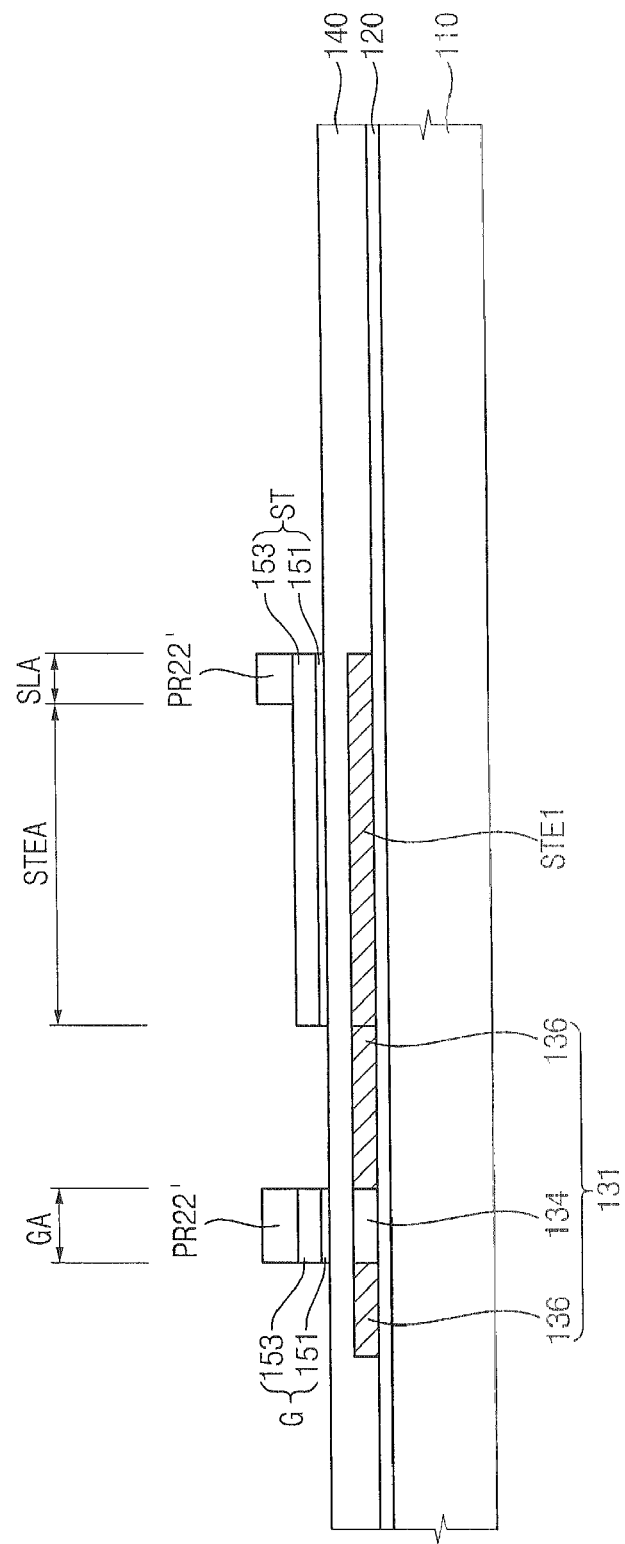

Referring to FIGS. 1 and 8, the first photo-pattern PR21 is ashed to form a second remaining photo-pattern PR22' disposed in the gate electrode area GA, the gate line area (not shown) and the storage line area SLA. The second photo-pattern PR22 is removed to expose the upper layer 153 of the storage metal pattern ST corresponding to the storage electrode area STEA.

An exposed upper layer 143 of the storage metal pattern ST corresponding to the storage electrode area STEA is removed by using the second remaining photo-pattern PR22' as a mask to form the second storage electrode STE2. Thus, the second storage electrode STE2 includes the lower layer 151 including a transparent conductive material. Therefore, the second storage electrode STE2 has a surface enough to form the storage capacitor CST and increases an aperture ratio of the pixel P. Each of the gate electrode G, the gate line GL and the storage line SL includes the lower layer 151 and the upper layer 153.

The second remaining photo-pattern PR22' is removed through a stripping process.

Figure 9:
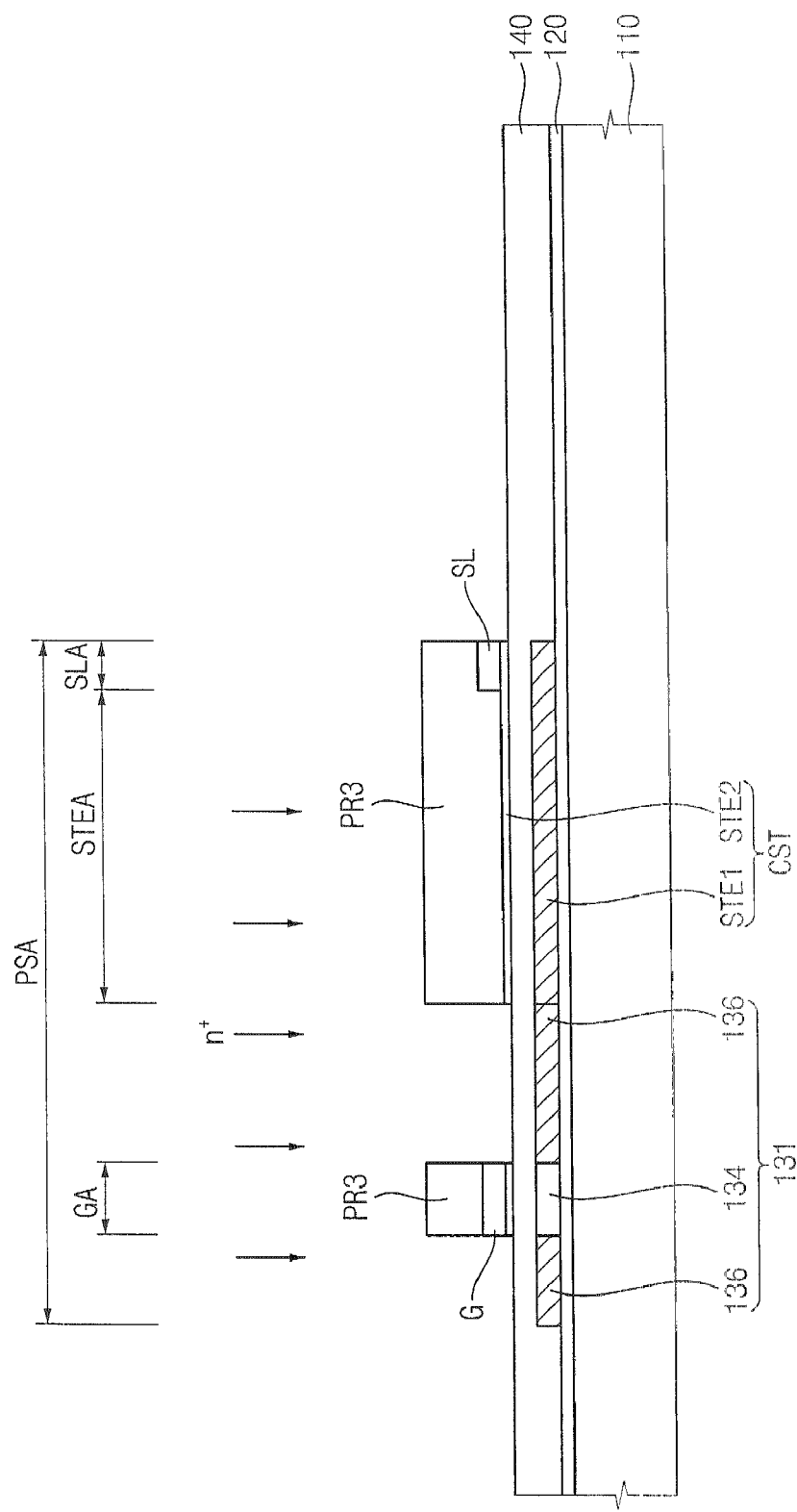

Referring to FIGS. 1 and 9, a third photoresist film is coated on the first base substrate 110 having the gate electrode G, the gate line GL, the second storage electrode STE2 and the storage line SL. The third photoresist film is patterned to form a third photo-pattern PR3. The third photo-pattern PR3 is formed on the channel portion 134, the second storage electrode STE2 and the storage line SL. The polycrystalline silicon layer is secondly doped with impurities by using the third photo-pattern PR3 as a mask to form the doped portion 136. Particularly, n⁺ impurities may be implanted into the doped portion 136 at a concentration of about $1E15/cm^2$.

The third photo-pattern PR3 is removed through a stripping process.

Figure 10:
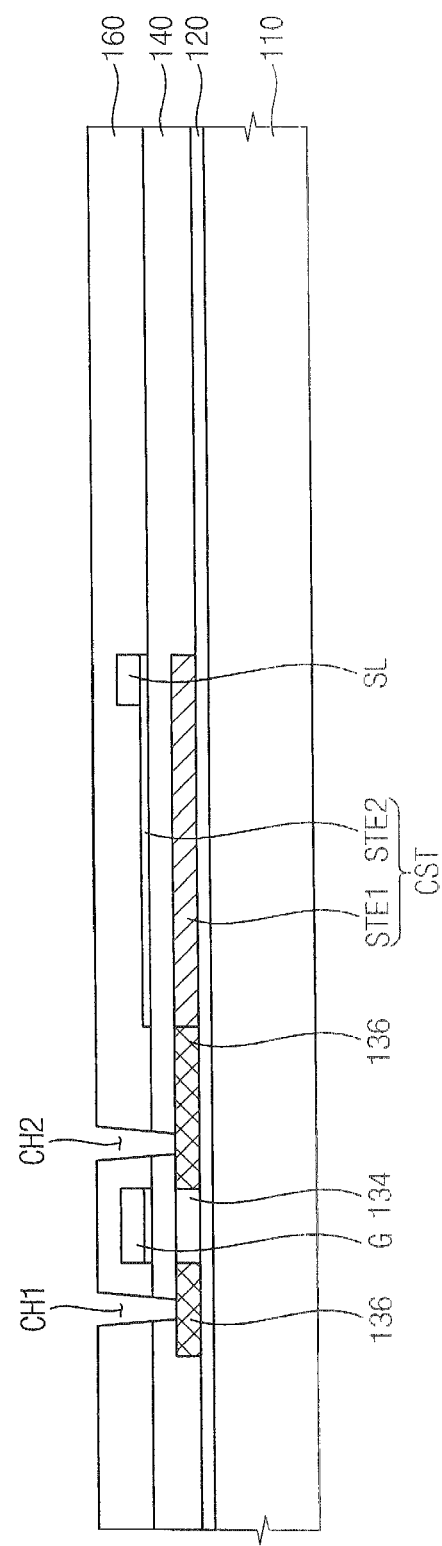

Referring to FIGS. 1 and 10, a second insulating layer 160 is formed on the first base substrate 110 having the gate electrode G, the gate line GL, the second storage electrode STE2 and the storage line SL.

A portion of each of the first and the second insulating layers 140 and 160 is removed to form a first contact hole CH1 and a second contact hole CH2, through which the doped portion 136 is exposed.

Figure 11:
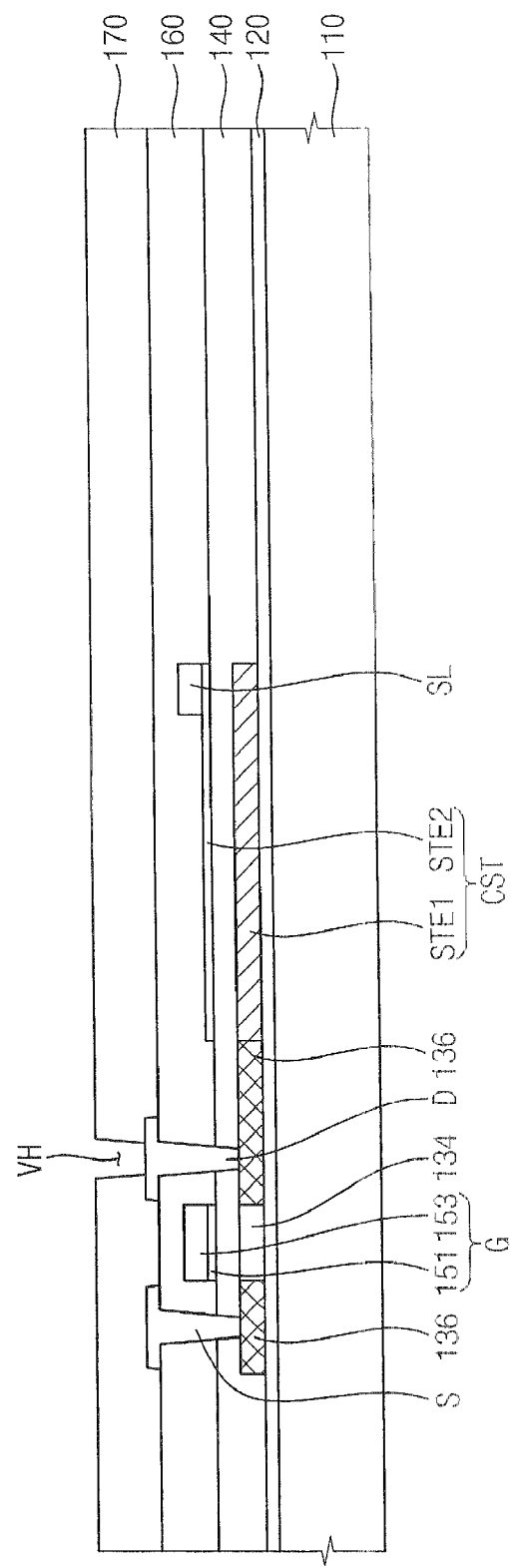

Referring to FIGS. 1 and 11, a source metal layer is formed on the first base substrate 110 having the first and the second contact holes CH1 and CH2 so that the source metal layer makes contact with the doped portion 136 through the first and the second contact holes CH1 and CH2.

The source metal layer may include, for example, copper, a copper alloy, aluminum, an aluminum alloy, silver, a silver alloy, molybdenum, a molybdenum alloy, chromium, tantalum, and/or titanium. Furthermore, the source metal layer may include a single layer or a multiple layer having a plurality of metal layers including a metal different from each other. Particularly, the source metal layer may include, for example, molybdenum and/or a molybdenum alloy.

The source metal layer is patterned to form a source metal pattern. The source metal pattern includes the source electrode S making contact with the doped portion 136 through the first contact hole CH1, the drain electrode D making contact with the doped portion 136 through the second contact hole CH2 and the source line DL that crosses the gate line GL and is electrically connected to the source electrode S.

A third insulating layer 170 is formed on the first base substrate 110 having the source metal pattern. A portion of the third insulating layer 170 is removed to form a via hole VH, through which the drain electrode D is exposed.

Figure 12:
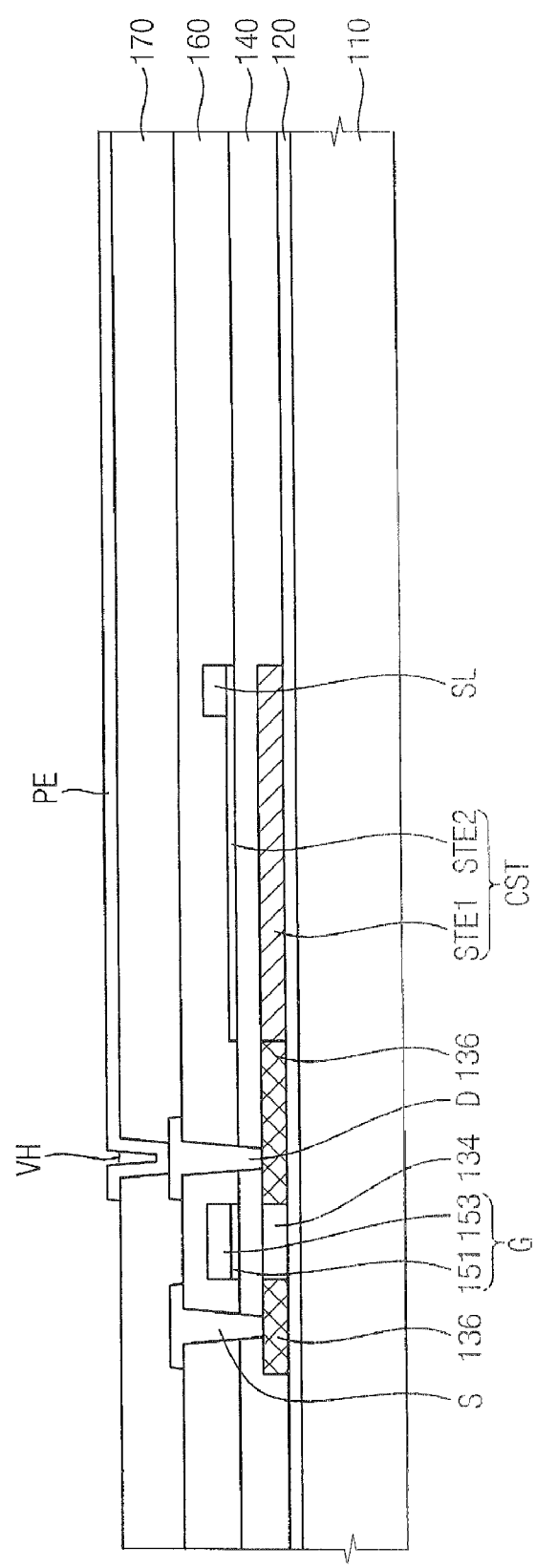

Referring to FIGS. 1 and 12, a transparent conductive material is deposited on the first base substrate 170 having the via hole VH. The transparent conductive material is patterned to form the pixel electrode PE. The transparent conductive material may include a metal oxide and/or a metal nitride, which has, for example, indium, strontium, zinc, aluminum, and/or gallium. The pixel electrode PE is electrically connected to the drain electrode D through the via hole VH.

Figure 13:
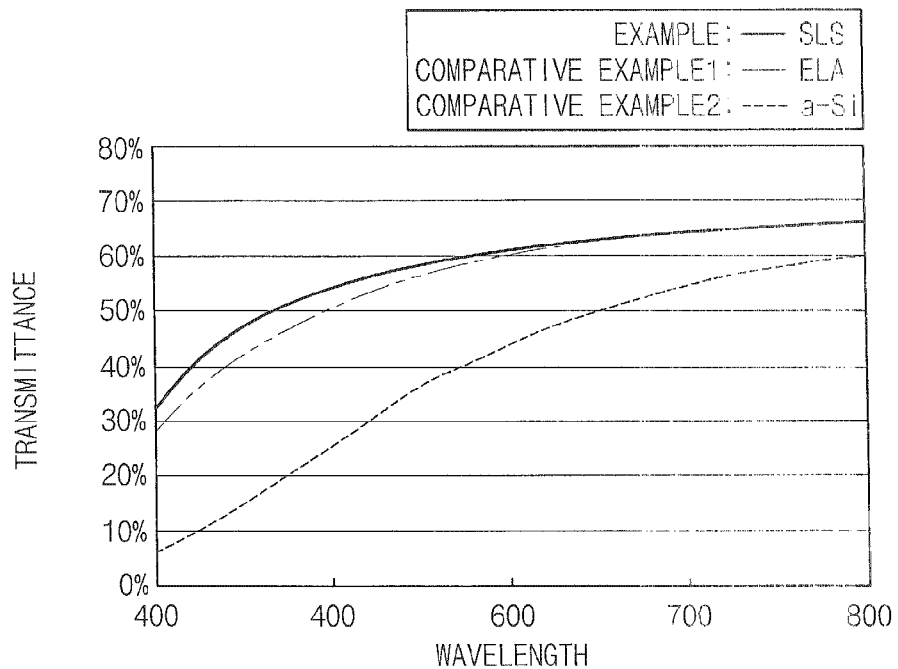
FIG. 13 is a graph showing a transmittance of the polycrystalline silicon layer of the display apparatus according to an exemplary embodiment of the present invention.

FIG. 13 is a graph showing a transmittance of the polycrystalline silicon layer of the display apparatus according to an exemplary embodiment of the present invention.

Referring to FIG. 13, Example shows a transmittance of a polycrystalline silicon layer that is crystallized through the SLS process and has a thickness of about 300 Å. Comparative Example 1 shows a transmittance of a polycrystalline silicon layer that is crystallized through an ELA process and has a thickness of about 300 Å. Comparative Example 2 shows a transmittance of an amorphous silicon layer that is not crystallized and has a thickness of about 300 Å.

As shown in FIG. 13, the transmittance of Example was about 33% with respect to a wavelength of about 400 nm, and about 55% with respect to a wavelength of about 480 nm, and about 63% with respect to a wavelength of about 600 nm.

The transmittance of Comparative Example 1 was about 28% with respect to a wavelength of about 400 nm, and about 50% with respect to a wavelength of about 480 nm, and about 60% with respect to a wavelength of about 600 nm.

The transmittance of Comparative Example 2 was about 8% with respect to a wavelength of about 400 nm, and about 25% with respect to a wavelength of about 480 nm, and about 45% with respect to a wavelength of about 600 nm.

As above, the transmittance of Example was greater than the transmittances of Comparative Examples 1 and 2. Particularly, the transmittance of Example was greater than the transmittance of Comparative Example 1 with respect to a wavelength of about 400 nm to about 600 nm.

Thus, it can be noted that the transmittance of the polycrystalline silicon layer crystallized through the SLS process is greater than the transmittance of the polycrystalline silicon layer crystallized through the ELA process.

Figure 14:
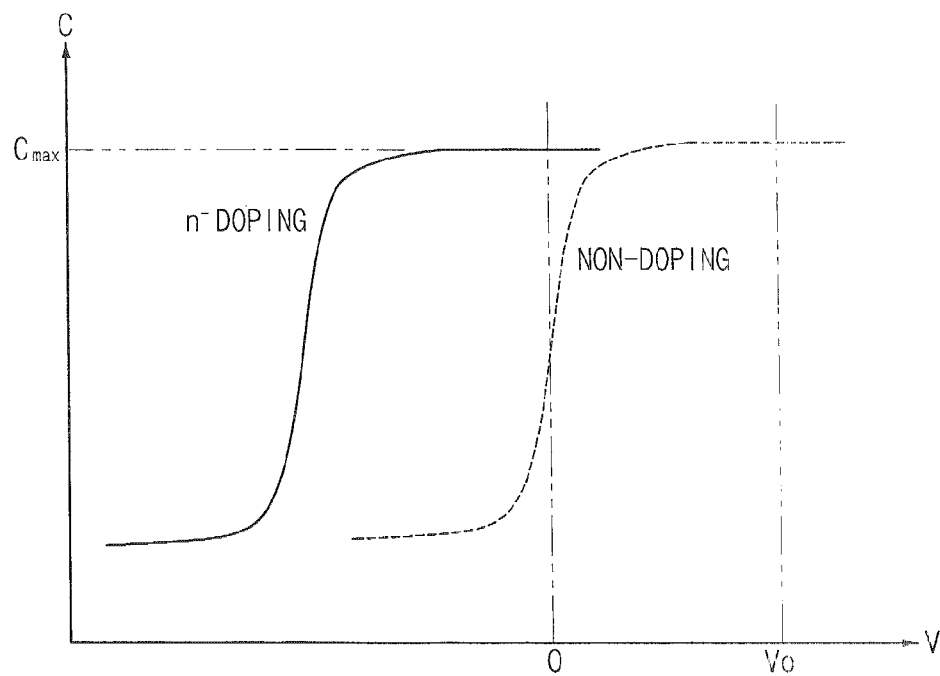
FIG. 14 is a graph showing a capacitance of the storage capacitor of the display apparatus according to an exemplary embodiment of the present invention.

FIG. 14 is a graph showing a capacitance of the storage capacitor of the display apparatus according to an exemplary embodiment of the present invention. Particularly, FIG. 14 shows a variation of the capacitance of the storage capacitor with respect to a voltage applied to the storage capacitor.

Referring to FIG. 14, when a storage electrode of the storage capacitor included a polycrystalline silicon layer that was not doped with impurities, the storage capacitor NON-DOPING had a maximum capacitance Cmax with respect to a voltage more than 0V. In contrast, when a storage electrode of the storage capacitor included a polycrystalline silicon layer that was doped with impurities, the storage capacitor n$^-$DOPING had a maximum capacitance Cmax with respect to 0V.

The storage capacitor that has the storage electrode including the polycrystalline silicon layer doped with impurities has a relatively great capacitance. Thus, an operating reliability of a display apparatus having the storage capacitor may be improved.

According to at least one embodiment of the present invention, a storage capacitor has a transparent storage electrode to increase an aperture ratio of a pixel without reducing a size of the storage electrode. Furthermore, the storage electrode has a polycrystalline silicon layer that is crystallized through the SLS process to increase a transmittance of the storage electrode.

The storage capacitor has a first storage electrode including the polycrystalline silicon layer that has a relatively great transmittance and a second storage electrode that overlaps with the first storage electrode and includes a transparent conductive material. Thus, an aperture ratio of a display substrate and brightness of a display apparatus having the display substrate may be improved.

Although the illustrative embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A display substrate comprising:
   a switching element comprising:
   a polycrystalline silicon layer having a channel portion and a doped portion;
   a gate electrode that is formed on the channel portion, the gate electrode including a first lower layer and a first upper layer, the first lower layer of the gate electrode comprising a transparent conductive material; and
   a source electrode and a drain electrode, the source and drain electrodes making contact with the doped portion;
   a storage capacitor comprising:
   a first storage electrode formed from substantially the same layer as the polycrystalline silicon layer; and
   a second storage electrode overlapped with the first storage electrode and including a second lower layer and a second upper layer, wherein the second lower layer is formed from substantially the same layer as the first lower layer of the gate electrode, and the second upper layer is formed from substantially the same layer as the first upper layer of the gate electrode, the second upper layer formed on a portion of the second lower layer such that at least a portion of an upper surface of the second lower layer is exposed; and a pixel electrode electrically connected to the switching element.

2. The display substrate of claim 1, wherein the second storage electrode is overlapped with the pixel electrode.

3. The display substrate of claim 1, wherein the first storage electrode is doped with impurities at a concentration lower than a concentration at which the doped portion is doped with the impurities.

4. The display substrate of claim 1, wherein a thickness of the polycrystalline silicon layer is about 200 Å to about 400 Å.

5. A display substrate comprising:
a polycrystalline silicon layer having a doped portion and a channel portion and a first storage electrode;
a gate electrode that is formed on the channel portion and has a first lower layer comprising a transparent conductive material and a first upper layer comprising a metal material;
a source electrode and a drain electrode, the source and drain electrodes making contact with the doped portion;
a second storage electrode overlapped with the first storage electrode and including a second lower layer and a second upper layer, wherein the second lower layer is formed from substantially the same layer as the first lower layer of the gate electrode, and the second upper layer is formed from substantially the same layer as the first upper layer of the gate electrode, the second upper layer formed on a portion of the second lower layer such that at least a portion of an upper surface of the second lower layer is exposed; and
a pixel electrode electrically connected to the drain electrode.

6. The display substrate of claim 5, wherein the polycrystalline silicon layer is crystallized through a sequential lateral solidification process.

7. The display substrate of claim 6, wherein the first storage electrode is doped with impurities at a concentration lower than a concentration at which the doped portion is doped with the impurities.

8. A display apparatus comprising:
a display substrate having a plurality of pixels, each of the pixels comprising:
a switching element having a polycrystalline silicon layer comprising a channel portion and a doped portion, a gate electrode that is formed on the channel portion and has a first lower layer and a first upper layer, a source electrode and a drain electrode, the source and drain electrodes making contact with the doped portion, the first lower layer of the gate electrode comprising a transparent conductive material;
a storage capacitor having a first storage electrode formed from substantially the same layer as the polycrystalline silicon layer and a second storage electrode overlapped with the first storage electrode and including a second lower layer and a second upper layer, wherein the second lower layer is formed from substantially the same layer as the first lower layer of the gate electrode, and the second upper layer is formed from substantially the same layer as the first upper layer of the gate electrode, the second upper layer formed on a portion of the second lower layer such that at least a portion of an upper surface of the second lower layer is exposed; and
a pixel electrode electrically connected to the switching element;
a substrate that faces the display substrate and is combined with the display substrate; and
a liquid crystal layer interposed between the display substrate and the substrate.

9. The display apparatus of claim 8, wherein the first storage electrode is doped with impurities at a concentration lower than a concentration at which the doped portion is doped with the impurities.

10. The display apparatus of claim 8, wherein the second storage electrode is overlapped with the pixel electrode.

11. The display apparatus of claim 8, wherein the polycrystalline silicon layer is crystallized through a sequential lateral solidification process.

* * * * *